United States Patent
Murata et al.

(10) Patent No.: US 9,906,197 B2
(45) Date of Patent: Feb. 27, 2018

(54) SIGNAL PROCESSING APPARATUS AND SIGNAL PROCESSING METHOD

(71) Applicant: Sony Corporation, Tokyo (JP)

(72) Inventors: Yasunobu Murata, Tokyo (JP); Kohei Asada, Kanagawa (JP)

(73) Assignee: Sony Corporation, Tokyo (JP)

(*) Notice: Subject to any disclaimer, the term of this patent is extended or adjusted under 35 U.S.C. 154(b) by 546 days.

(21) Appl. No.: 13/681,444

(22) Filed: Nov. 20, 2012

(65) Prior Publication Data

US 2013/0142359 A1    Jun. 6, 2013

(30) Foreign Application Priority Data

Dec. 6, 2011   (JP) .................................. 2011-266974

(51) Int. Cl.
*H03G 5/00* (2006.01)
*H03G 3/00* (2006.01)
*H03G 5/16* (2006.01)

(52) U.S. Cl.
CPC ................ *H03G 3/00* (2013.01); *H03G 5/005* (2013.01); *H03G 5/165* (2013.01); *G10H 2250/035* (2013.01)

(58) Field of Classification Search
CPC .......... H03G 3/00; H03G 5/165; H03G 5/005; H03G 5/025; H04R 3/04; H04S 7/307; G10H 2250/035
USPC ........... 381/98, 99, 101, 102, 119, 120, 100; 333/132, 133; 369/3; 455/132, 133
See application file for complete search history.

(56) References Cited

U.S. PATENT DOCUMENTS

| | | | | |
|---|---|---|---|---|
| 6,208,687 B1* | 3/2001 | Clemow | ............ | H03H 17/0294 375/232 |
| 2012/0109348 A1* | 5/2012 | Matsunaga et al. | ............ | 700/94 |

FOREIGN PATENT DOCUMENTS

| JP | 06-141236 A | 5/1994 |
|---|---|---|
| JP | 2009-302784 A | 12/2009 |

* cited by examiner

*Primary Examiner* — Vivian Chin
*Assistant Examiner* — Con P Tran
(74) *Attorney, Agent, or Firm* — Chip Law Group

(57) ABSTRACT

A signal processing apparatus includes: a control section; a signal processing section connected with a plurality of signal processing elements and configured to perform signal processing for enhancing or attenuating an input signal in a specific frequency band; and a crossfade signal section including a crossfade signal processing element capable of replacing at least one of the signal processing elements, wherein the control section is configured to control any one of the signal processing elements among the plurality of signal processing elements, and the crossfade signal processing element, to crossfade to the crossfade signal processing element having the signal processing element as a new characteristic, to perform processing for replacing any one of the signal processing elements by the crossfade signal processing element, and to perform the processing on remaining signal processing elements of the plurality of signal processing elements in the signal processing section.

10 Claims, 13 Drawing Sheets

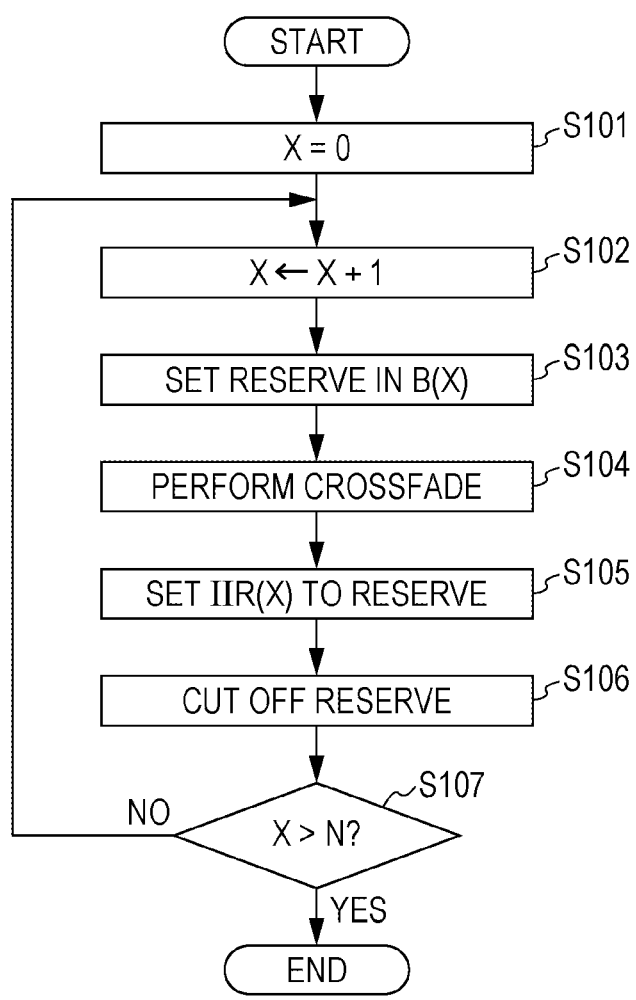

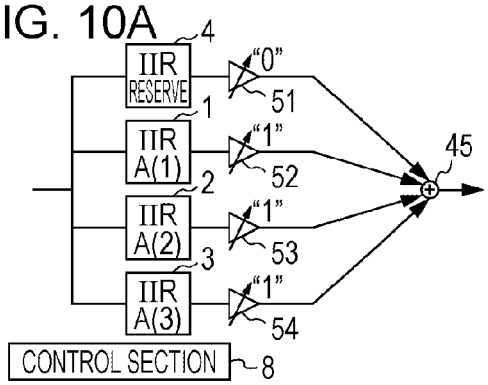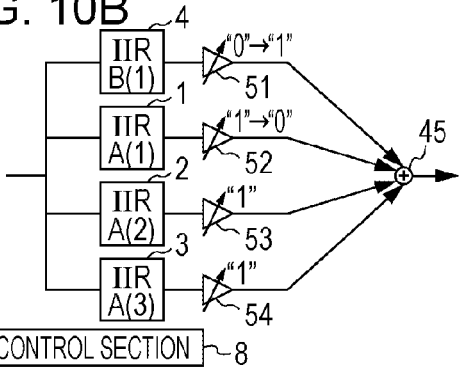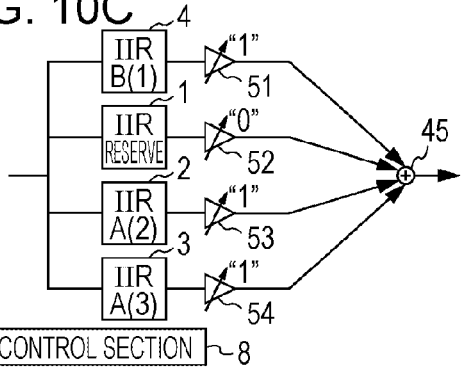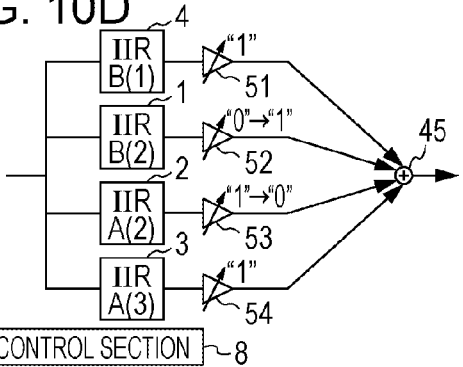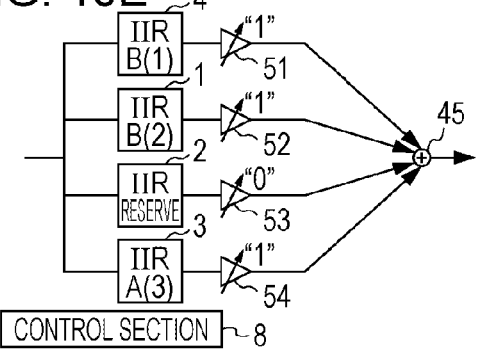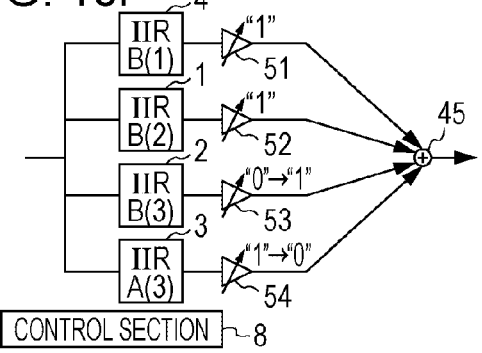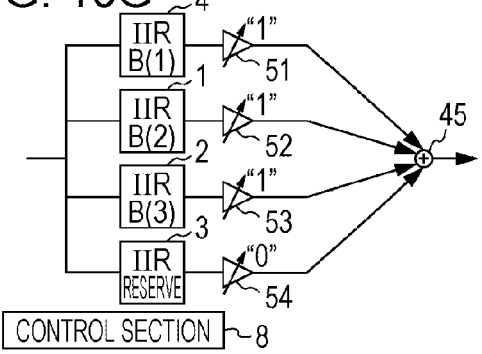

SIGNAL PROCESSING APPARATUS AND SIGNAL PROCESSING METHOD

BACKGROUND

The present disclosure relates to a signal processing technique for performing crossfade processing on a plurality of input signals to output a selected signal. More particularly, the present disclosure relates to a signal processing technique for performing crossfade processing on a plurality of signals whose signal characteristic has been changed using a plurality of signal processing elements.

Related techniques have been disclosed in Japanese Unexamined Patent Application Publication Nos. 2009-302784 and 06-141236.

The disclosures described in the above patent documents relate to techniques for performing crossfade processing on signals.

In an signal processing apparatus in which a signal characteristic is changed by a combination of a plurality of signal processing elements, if a characteristic is changed in a state of inputting one input signal (for example, an audio signal) without a break of the signal, it becomes necessary to perform crossfade processing using a crossfader.

SUMMARY

Incidentally, when a characteristic is changed by crossfade processing using a crossfader, a same number of signal processing elements as an original number of signal processing elements becomes necessary. That is to say, a double number of resources become necessary. However, this becomes difficult to achieve particularly in a situation of limited resources, by restriction of a circuit size, and by restriction of power consumption, etc.

It is desirable to achieve a signal processing apparatus capable of performing crossfade processing with as little resource as possible in order to change a characteristic.

According to an embodiment of the present disclosure, there is provided a signal processing apparatus including: a control section; a signal processing section connected with a plurality of signal processing elements and configured to perform signal processing for enhancing or attenuating an input signal in a specific frequency band; and a crossfade signal section including a crossfade signal processing element capable of replacing at least one of the signal processing elements among the plurality of signal processing elements, wherein the control section is configured to control any one of the signal processing elements among the plurality of signal processing elements, and the crossfade signal processing element in the crossfade signal section, to crossfade to the crossfade signal processing element having the signal processing element as a new characteristic, to perform processing for replacing any one of the signal processing elements by the crossfade signal processing element, and to perform the processing on remaining signal processing elements of the plurality of signal processing elements in the signal processing section.

According to another embodiment of the present disclosure, there is provided a method of processing a signal to change a characteristic of a signal processing apparatus including a control section, a signal processing section connected with a plurality of IIR filters and configured to perform signal processing for enhancing or attenuating an input signal in a specific frequency band, and a crossfade signal section including a crossfade IIR filter capable of replacing at least one of the IIR filters among the plurality of IIR filters, the method including: controlling the crossfade IIR filter and changing the crossfade IIR filter to have a new characteristic; crossfading any one of the IIR filters among the plurality of IIR filters to the crossfade IIR filter having the new characteristic; replacing any one of the IIR filters by the crossfade IIR filter; and enabling to perform the changing to have a new characteristic, the crossfading, and the replacing on the plurality of IIR filters.

It is possible to reduce resources, such as signal processing elements, for example, filter elements, etc. Thereby, it is possible to change a characteristic of an input signal in limited resources. Further, it is possible to reduce power consumption by reduction in resources.

BRIEF DESCRIPTION OF THE DRAWINGS

FIG. 2 is a flowchart according to the first embodiment;
FIGS. 10A-10G are block diagrams according to a sixth embodiment.

DETAILED DESCRIPTION OF EMBODIMENTS

Figure 1A:
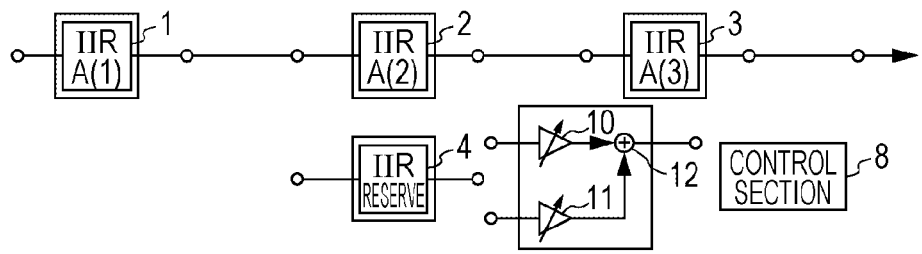
FIGS. 1A-1G are block diagrams according to a first embodiment.

In the following, descriptions will be given of embodiments of the present disclosure, etc., in the following order. In this regard, in the embodiments, descriptions will be given of cases where a combination of a plurality of IIR filters is used as filter elements, which are signal processing elements, as examples. A filter element is not limited to an IIR filter. A FIR filter may be used.

1. Overview of crossfade processing operation
2. First embodiment
3. Second embodiment
4. Third embodiment
5. Fourth embodiment
6. Fifth embodiment
7. Sixth embodiment 1. Overview of Crossfade Processing Operation First, descriptions will be given of characteristics of a mid presence filter (MPF) and a band-pass filter with reference to FIG. 11.

Figure 11:
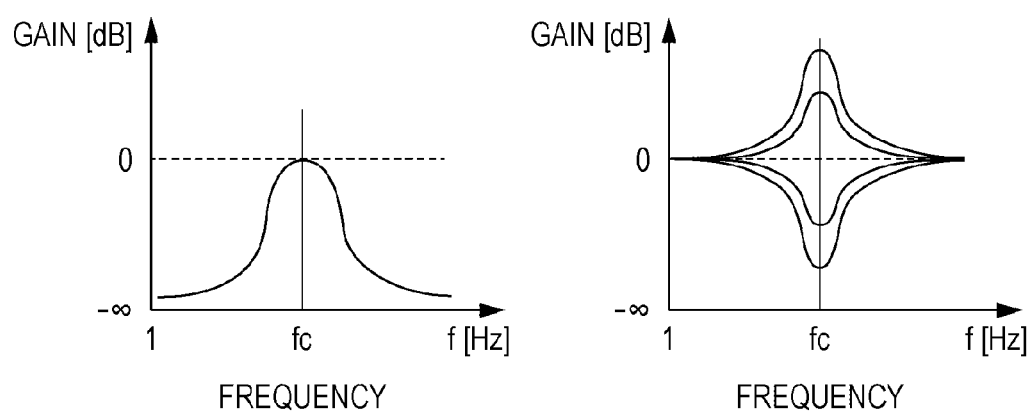
FIG. 11 is a diagram illustrating characteristics of a bandpass filter and a characteristic of MPF.

As illustrated on the right in FIG. 11, an MPF has a function of enhancing or attenuating a characteristic with a predetermined frequency (fc) as center. A band-pass filter has a function of passing only a predetermined frequency (fc), and not passing the other frequencies (attenuating). In an MPF, a bandwidth is variable in the same manner as a band-pass filter. Also, it is possible to change an amount of amplification or an amount of attenuation.

An equalizer that changes a frequency characteristic of an input signal (for example, audio signal) is formed by connecting MPFs in series. Also, a normal MPF is formed by connecting IIR filters in series.

The present disclosure is an advanced sequence of an IIR filter signal processing sequence including the MPF.

A description will be given of an overview of operation for performing crossfade processing on a signal to change a signal characteristic with reference to FIG. 12.

Figure 12:
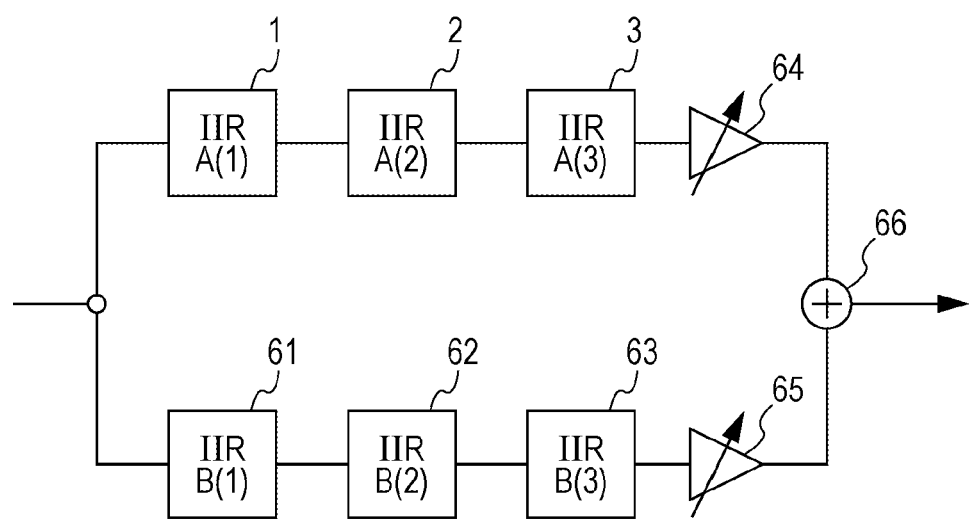
FIG. 12 is a block diagram of a general signal processing apparatus that changes a signal characteristic and causes crossfade.

FIG. 12 illustrates a normal configuration in the case of performing crossfade processing on a signal to change a signal characteristic.

IIR filters 1, 2, and 3 are filters for performing original signal processing. Thereby, as described above, an equalizer is formed. An input signal passes through the IIR filters 1, 2, and 3 so that the original signal processing is performed.

IIR filters 61, 62, and 63 are filters for performing new signal processing. A signal path is changed so that an input signal passes through the IIR filters 61, 62, and 63, and thereby the new signal processing is performed.

A change of paths is made such that an input signal (for example, an audio signal) is not lost. For this purpose, one signal is faded in, and at the same time, the other is faded out. Such a change is called crossfade processing. By an amplifier 64, an amplifier 65, and an adder 66, crossfade processing is achieved. The amplifiers 64 and 65 are called faders. By controlling amplifiers 64 and 65, it is possible to change the signal path from the path of the IIR filters 1, 2, and 3 to the path of the IIR filters 61, 62, and 63, and to change the characteristic of the signal path without stopping the input signal.

However, in the case of the configuration in FIG. 12, the same number of IIR filters are necessary as that necessary for performing original signal processing, and thus a problem occurs in effective utilization of hardware.

2. First Embodiment

FIGS. 1A, 1B, 1C, 1D, 1E, 1F, and 1G are block diagrams for explaining a first embodiment of the present disclosure. These block diagrams represent configurations of a signal processing apparatus, and represent connection states of components for individual processing for signal processing in FIG. 1A to FIG. 1G.

A signal processing apparatus according to the present embodiment includes IIR filters 1, 2, and 3, a reserve IIR filter 4, amplifiers 10 and 11, an adder 12 and a control section 8.

The signal processing apparatus is assumed to be an equalizer. The IIR filter 1, 2, and 3 constitute, with respect to an input signal (for example, an audio signal), for example, an equalizer that performs signal processing for enhancing or attenuating a specific frequency band signal. Here, it is assumed that the IIR filters are formed to be in three stages in series.

The reserve IIR filter 4 is in an unused state, and is used for changing a characteristic of the equalizer.

The amplifiers 10 and 11, and the adder 12 are crossfaders, and are used for crossfade processing.

The control section 8 performs connection control of the individual components, and controls the amplifiers 10 and 11, and the adder 12 to perform crossfade processing control.

A description will be given of a processing procedure for changing a characteristic of an equalizer according to the present embodiment with reference to FIGS. 1A to 1G. In order to change the characteristic, the IIR filters 1, 2, and 3 are subjected to crossfading in sequence one by one.

FIG. 1A illustrates an original state. An input signal is subjected to signal processing through the IIR filters 1, 2, and 3, and is output.

Figure 1B:
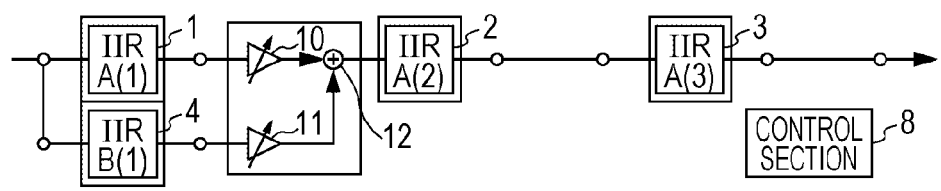

FIG. 1B is a diagram illustrating a connection in which a characteristic of the IIR filter 1 is changed and crossfading is performed. A crossfader including a reserve (unused) IIR filter 4, the amplifiers 10, 11 and the adder 12 is connected to a stage of the IIR filter 1 as illustrated in FIG. 1B.

At this time, the IIR filter 4 is set to a characteristic B(1) to be changed. The original characteristic of the IIR filter 1 is A(1). Next, the crossfader performs crossfading from the IIR filter 1 to the IIR filter 4. After crossfading is complete, the invalidated IIR filter 1 and the crossfader that has completed crossfading are cut off, and the buffer of the IIR filter 1 is cleared. That is to say, the characteristic of the IIR filter 1, A(1), is cleared and changed to reserve (unused). Thereby, it is possible to replace the IIR filter 1 having the characteristic A(1) by the IIR filter 4 having the characteristic B(1).

Figure 1C:
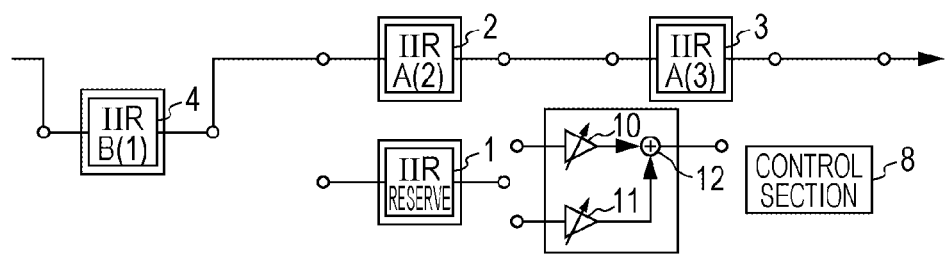

FIG. 1C is a diagram after the IIR filter 1 has been replaced by the IIR filter 4. The IIR filter 1 becomes reserved (unused).

Figure 1D:
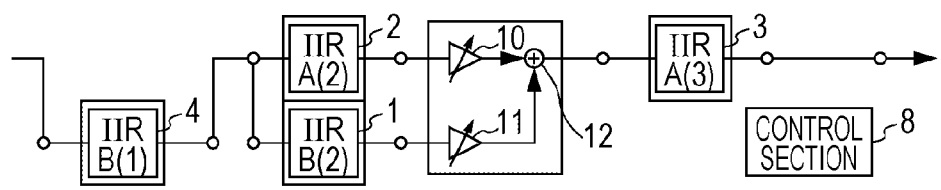

FIG. 1D is a diagram illustrating a connection in which a characteristic of the IIR filter 2 is changed and crossfading is performed. A crossfader including a reserve (unused) IIR filter 1 and the amplifiers 10, 11 and the adder 12 are connected to a stage of the IIR filter 2 as illustrated in FIG. 1D.

At this time, the IIR filter 1 is set to a characteristic B(2) to be changed. The original characteristic of the IIR filter 2 is A(2). Next, the crossfader performs crossfading from the IIR filter 2 to the IIR filter 1. After the crossfading is complete, the invalidated IIR filter 2 and the crossfader that has completed crossfading are cut off, and the buffer of the IIR filter 2 is cleared. That is to say, the characteristic of the IIR filter 2, A(2), is cleared and reserved (unused). Thereby, it is possible to replace the IIR filter 2 having the characteristic A(2) by the IIR filter 1 having the characteristic B(2).

Figure 1E:
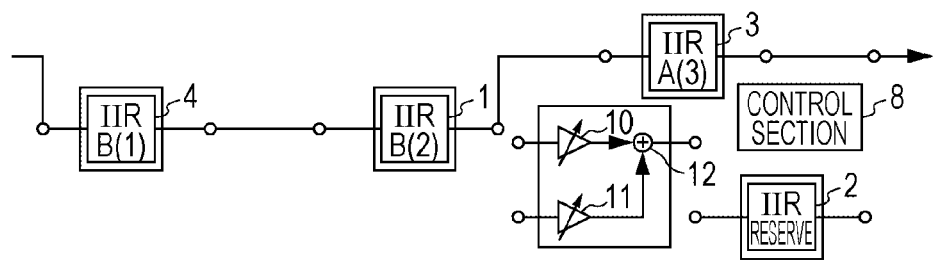

FIG. 1E is a diagram after the IIR filter 2 has been replaced by the IIR filter 1. The IIR filter 2 becomes reserved (unused).

Figure 1F:
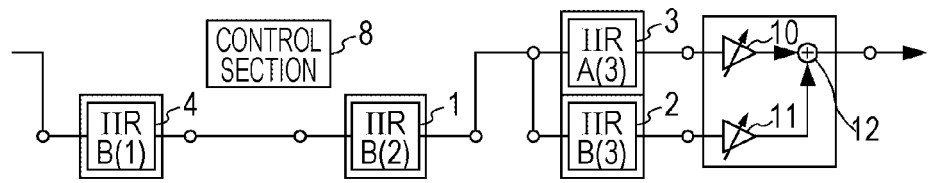

FIG. 1F is a diagram illustrating a connection in which a characteristic of the IIR filter 3 is changed and crossfading is performed. A crossfader including a reserve (unused) IIR filter 2 and the amplifiers 10, 11 and the adder 12 are connected to a stage of the IIR filter 3 as illustrated in FIG. 1F.

At this time, the IIR filter 2 is set to a characteristic B(3) to be changed. The original characteristic of the IIR filter 3 is A(3). Next, the crossfader performs crossfading from the IIR filter 3 to the IIR filter 2. After crossfading is complete, the invalidated IIR filter 3 and the crossfader that has completed crossfading are cut off, and the buffer of the IIR filter 3 is cleared. That is to say, the characteristic of the IIR filter 3, A(3), is cleared and reserved (unused). Thereby, it is possible to replace the IIR filter 3 having the characteristic A(3) by the IIR filter 2 having the characteristic B(3).

Figure 1G:
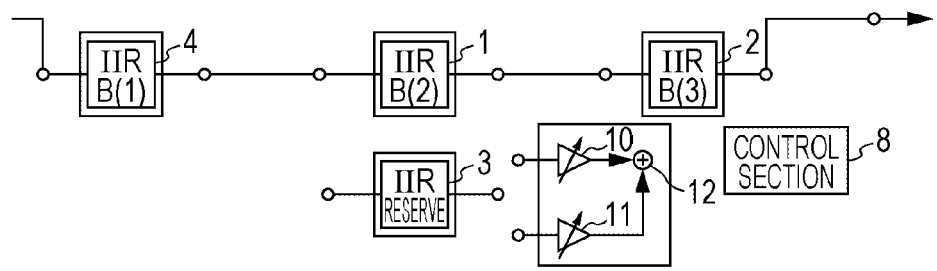

FIG. 1G is a diagram after the IIR filter 3 has been replaced by the IIR filter 2. The IIR filter 3 becomes reserved (unused).

By the above processing, the IIR filter 1 having the characteristic A(1), the IIR filter 2 having the characteristic A(2), and the IIR filter 3 having the characteristic A(3), which are included in the equalizer, are replaced by the IIR filter 4 having the characteristic B(1), the IIR filter 1 having the characteristic B(2), and the IIR filter 2 having the characteristic B(3), respectively, and thus the characteristic of the equalizer can be changed.

In this case, it is sufficient to have one IIR filter in order to change the characteristic. Compared with the method described with reference to FIG. 12, it is possible to drastically reduce the number of IIR filters, that is to say, to save hardware resources. Also, the number of IIR filters is reduced, and thus it becomes possible to save power.

However, overall processing time is increased by the number of crossfaders compared with the case in FIG. 12, but a processing speed per unit time is increased, and thus it causes no problem.

FIG. 2 is a flowchart according to a first embodiment of the present disclosure. The above-described procedure is expressed in a form of a flowchart.

The above-described procedure will be described with reference to FIG. 2.

In step S101, the control section 8 sets X to 0. That is to say, the control section 8 clears X.

In step S102, the control section 8 counts up X. An initial value of X is 1.

In step S103, the control section 8 sets a reserve IIR filter 4, that is to say, an unused IIR filter 4 to have a characteristic of B(1).

In step S104, the control section 8 crossfades the IIR filter 1 having A(1) to the IIR filter 4 having B(1).

In step S105, the control section 8 changes the IIR filter 1 to reserve (unused).

In step S106, the control section 8 cuts off the crossfader including the IIR filter 3, the amplifiers 10, 11, and the adder 12.

In step S107, the control section 8 determines whether X exceeds 3 or not. If X does not exceed 3, the processing from step S102 to step S106 is repeated until X becomes 3. If X exceeds 3, the processing is terminated.

By this processing, it is possible to replace the IIR filter 1 having the characteristic A(1), the IIR filter 2 having the characteristic A(2) and the IIR filter 3 having the characteristic A(3) by the IIR filter 4 having characteristic B(1), the IIR filter 1 having the characteristic B(2) and the IIR filter 2 having the characteristic B(3).

3. Second Embodiment

FIGS. 3A, 3B, 3C, and 3D are block diagrams for explaining a second embodiment of the present disclosure. The same reference letters are given to the same parts as those already described, and descriptions thereof will be omitted. These block diagrams represent configurations of a signal processing apparatus, and represent connection states of components for each processing for performing signal processing in FIG. 3A to FIG. 3D in the same manner as FIGS. 1A to 1G.

A signal processing apparatus according to the present embodiment includes IIR filters 1, 2, 3 and 7, reserve IIR filters 5, 6, amplifiers 10, 11, an adder 12 and a control section 8.

The signal processing apparatus is assumed to be an equalizer. The IIR filters 1, 2, 3 and 7 constitute, with respect to an input signal (for example, an audio signal), for example, an equalizer. Here, it is assumed that the IIR filters are formed to be in four stages in series.

The reserve IIR filters 5, 6 are in an unused state, and are used for changing a characteristic of the equalizer.

The amplifiers 10, 11, and the adder 12 are crossfaders, and are used for crossfade processing.

The control section 8 performs connection control of the individual components, and controls the amplifiers 10, 11, and the adder 12 to perform crossfade processing control.

In the present embodiment, the number of reserve (unused) IIR filters is added so that processing speed is aimed to be improved. In the present embodiment, one reserve (unused) IIR filter is added, and the filters are assumed to be IIR filters 5, 6.

A description will be given of a processing procedure for changing a characteristic of an equalizer according to the present embodiment with reference to FIGS. 3A to 3D. In order to change the characteristic, the IIR filters 1, 2 and the IIR filters 3, 7 are subjected to crossfading individually in sequence.

Figure 3A:
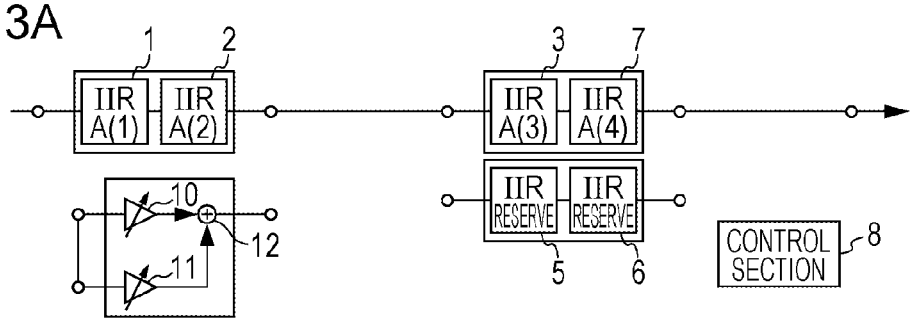
FIGS. 3A-3D are block diagrams according to a second embodiment.

FIG. 3A illustrates a state before the change. An input signal is subjected to signal processing through the IIR filters 1, 2, 3 and 7, and is output.

Figure 3B:
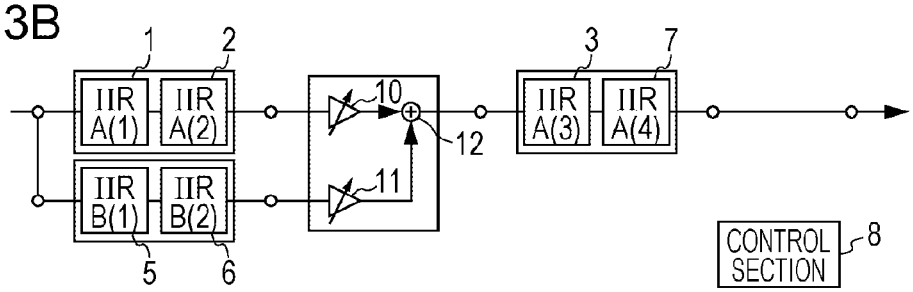

FIG. 3B is a diagram illustrating a connection in which characteristics of the IIR filters 1, 2 are changed and crossfading is performed. A crossfader including a reserve (unused) IIR filters 5, 6, the amplifiers 10, 11, and the adder 12 is connected to a stage of the IIR filters 1, 2 as illustrated in FIG. 3B.

At this time, the IIR filters 5, 6 are set to the characteristic B(1), B(2) to be changed, respectively. The original characteristics of the IIR filters 1, 2 are A(1), A(2), respectively. Next, the crossfader performs crossfading from the IIR filters 1, 2 to the IIR filters 5, 6. After the crossfading is complete, the invalidated IIR filters 1, 2 and the crossfader that has completed crossfading are cut off, and the buffers of the IIR filters 1, 2 are cleared. That is to say, A(1), A(2), which are characteristics of the IIR filter 1, 2, respectively, are cleared and changed to unused. That is to say, the characteristics are changed to reserved.

Thereby, it is possible to replace the IIR filters 1, 2 having the characteristic A(1), A(2) by the IIR filters 5, 6 having the characteristic B(1), B(2), respectively.

Figure 3C:
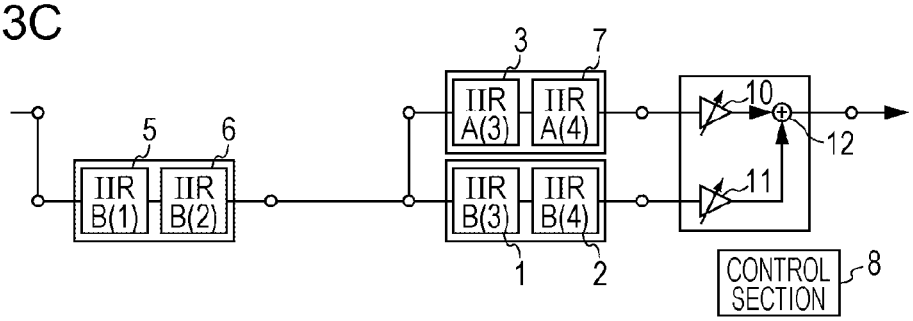

FIG. 3C is a diagram illustrating a connection in which characteristics of the IIR filters 3, 7 are changed and crossfading is performed. A crossfader including a reserve (unused) IIR filters 1, 2, the amplifiers 10, 11, and the adder 12 is connected to a stage of the IIR filter 3, 7 as illustrated in FIG. 3C.

At this time, the IIR filters 1, 2, which have become reserved (unused) in FIG. 3B, are set to have the characteristics B(3), B(4), respectively, to which changes are made. The original characteristics of the IIR filters 3, 7 are A(3), A(4), respectively. Next, the crossfader performs crossfading from the IIR filters 3, 7 to the IIR filters 1, 2, respectively. After the crossfading is complete, the invalidated IIR filters 3, 7 and the crossfader that has completed crossfading are cut off, and the buffers of the IIR filters 3, 7 are cleared. That is to say, A(3) and A(4), which are characteristics of the IIR filters 3, 7, are cleared and are set to unused. That is to say, the characteristics are reserved.

Thereby, it is possible to replace the IIR filter 3, 7 having the characteristic A(3), A(4) by the IIR filter 1, 2 having the characteristic B(3), B(4), respectively.

Figure 3D:
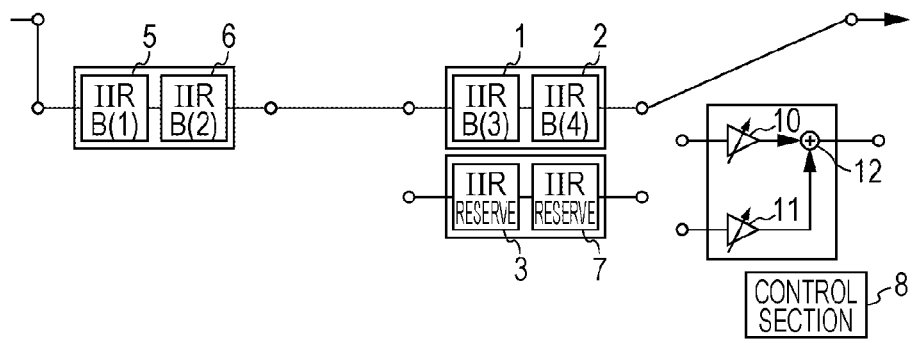

FIG. 3D is a diagram after the IIR filter 3 and the IIR filter 7 have been replaced by the IIR filter 1 and the IIR filter 2. The IIR filter 3 and the IIR filter 7 become reserved, and thus unused.

By the above processing, the IIR filter 1 having the characteristic A(1), the IIR filter 2 having the characteristic A(2), the IIR filter 3 having the characteristic A(3), and the IIR filter 4 having the characteristic A(4), which are included in the equalizer, are replaced by the IIR filter 5 having the characteristic B(1), the IIR filter 6 having the characteristic B(2), the IIR filter 1 having the characteristic B(3), and the IIR filter 2 having the characteristic B(4), respectively, and thus the characteristic of the equalizer can be changed.

In this case, the number of IIR filters for changing characteristics is two, and thus it is possible to complete overall processing at a speed two times the speed of the method described with reference to FIGS. 1A to 1G.

In the case where 100 IIR filters are used in a signal processing sequence of the equalizer, if 50 IIR filters are provided, it is possible to complete the entire transition by processing for two times, and thus it is possible to drastically increase the speed. At the same time, it becomes possible to reduce resources of 50 IIR filters.

Figure 4:
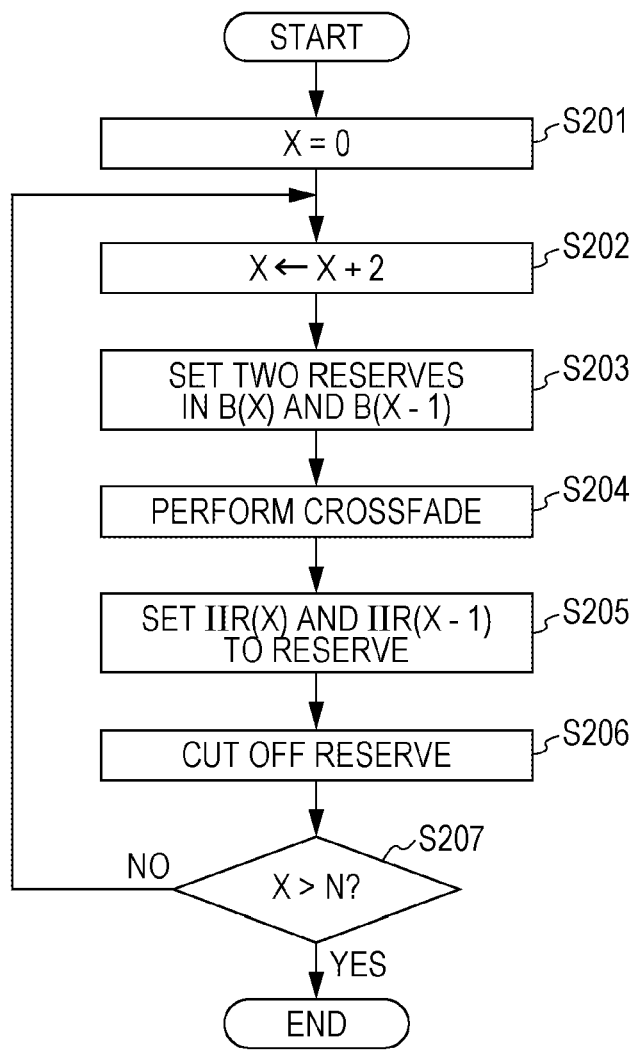
FIG. 4 is a flowchart according to the second embodiment.

FIG. 4 is a flowchart according to the second embodiment of the present disclosure. The above-described procedure is expressed in a form of a flowchart.

The above-described procedure will be described with reference to FIG. 4.

In step S201, the control section 8 sets X to 0. That is to say, the control section 8 clears X.

In step S202, the control section 8 counts up X by two. An initial value of X is 2.

In step S203, the control section 8 sets unused IIR filters 5, 6, that is to say, two reserved IIR filters 5, 6 to have characteristics of B(1), B(2), respectively.

In step S204, the control section 8 crossfades the IIR filter 1 having A(1) and the IIR filter 2 having the A(2) to the IIR filter 5 having B(1) and the IIR filter 6 having B(2), respectively.

In step S205, the control section 8 changes the IIR filter 1 and the IIR filter 2 to reserved (unused).

In step S206, the control section 8 cuts off the crossfader including the reserved (unused) IIR filter 1 and IIR filter 2, and the amplifiers 10, 11, and the adder 12.

In step S207, the control section 8 checks whether X exceeds 4 or not. If X does not exceed 4, processing from step S202 to step S206 is repeated until X becomes 4.

By this processing, it is possible to replace the IIR filter 1 having the characteristic A(1), the IIR filter 2 having the characteristic A(2), the IIR filter 3 having the characteristic A(3), and the IIR filter 7 having the characteristic A(4) by the IIR filter 5 having the characteristic B(1), the IIR filter 6 having the characteristic B(2), the IIR filter 1 having the characteristic B(3), and the IIR filter 2 having the characteristic B(4).

4. Third Embodiment

FIGS. 5A, 5B, 5C, and 5D are block diagrams for explaining a third embodiment of the present disclosure. The same reference letters are given to the same parts as those already described, and descriptions thereof will be omitted. These block diagrams represent configurations of a signal processing apparatus, and represent connection states of components for each processing for performing signal processing in FIG. 5A to FIG. 5D in the same manner as FIGS. 1A to 1G.

A signal processing apparatus according to the present embodiment includes IIR filters 1, 2, 3 and 7, reserve IIR filters 5, 6, amplifiers 10, 11, an adder 12 and a control section 8.

The signal processing apparatus is assumed to be an equalizer. The IIR filters 1, 2, 3 and 7 constitute, with respect to an input signal (for example, an audio signal), for example, an equalizer. Here, it is assumed that the IIR filters are formed to be in four stages in series.

The reserve IIR filters 5, 6 are in an unused state, and are used for changing a characteristic of the equalizer. In this case, it is possible to use as reserve IIR filters by changing the number of the reserve IIR filters.

The amplifiers 10, 11, and the adder 12 are crossfaders, and are used for crossfade processing.

The control section 8 performs connection control of the individual components, and controls the amplifiers 10, 11, and the adder 12 to perform crossfade processing control.

In the present embodiment, the number of reserve (unused) IIR filters is added so that processing speed is aimed to be improved in the same manner as the second embodiment. In the present embodiment, one reserve (unused) IIR filter is added, and two IIR filters 5, 6 are provided. However, it is possible to apply the two IIR filters together or to apply only one of the two.

A description will be given of a processing procedure for changing a characteristic of an equalizer according to the present embodiment with reference to FIGS. 5A to 5D. Here, it is assumed that the characteristic of the IIR filter 1 is not changed. It is assumed that the characteristics of the IIR filter 2, the IIR filter 3 and the IIR filter 7 are to be changed.

Figure 5A:
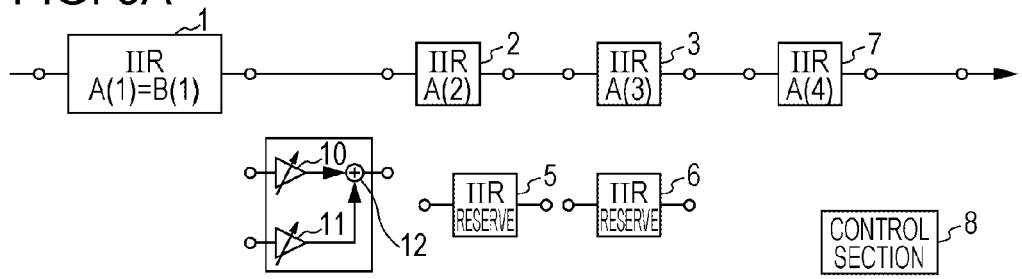
FIGS. 5A-5D are block diagrams according to a third embodiment.

FIG. 5A illustrates a state before a change. An input signal is subjected to signal processing through the IIR filters 1, 2, 3 and 7, and is output.

Figure 5B:
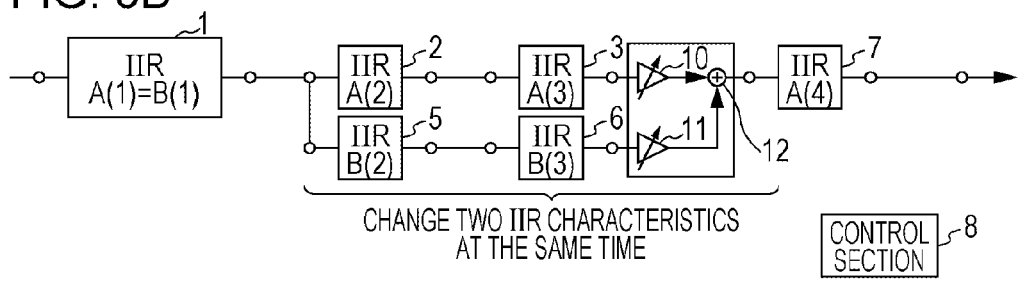

FIG. 5B is a diagram illustrating a connection in which the characteristics of the IIR filter 2, 3 are changed and crossfading is performed. A crossfader including the reserve (unused) IIR filters 5, 6, the amplifiers 10, 11 and the adder 12 is connected to stages of the IIR filters 2, 3 as illustrated in FIG. 5B.

At this time, the IIR filters 5, 6 are set to characteristic B(2), B(3), to which changes are made, respectively. The original characteristics of the IIR filter 2, 3 are A(2), A(3), respectively. Next, the crossfader performs crossfading from the IIR filters 2, 3 to the IIR filters 5, 6, respectively. After crossfading is complete, the invalidated IIR filter 2, 3 and the crossfader that has completed crossfading are cut off, and the buffers of the IIR filters 2, 3 are cleared. That is to say, A(2), A(3), which are the characteristics of the IIR filters 2, 3, respectively, are cleared and changed to unused. That is to say, the characteristics are changed to reserved.

Thereby, it is possible to replace the IIR filter 2, 3 having the characteristic A(2), A(3) by the IIR filter 5, 6 having the characteristic B(2), B(3), respectively.

Figure 5C:
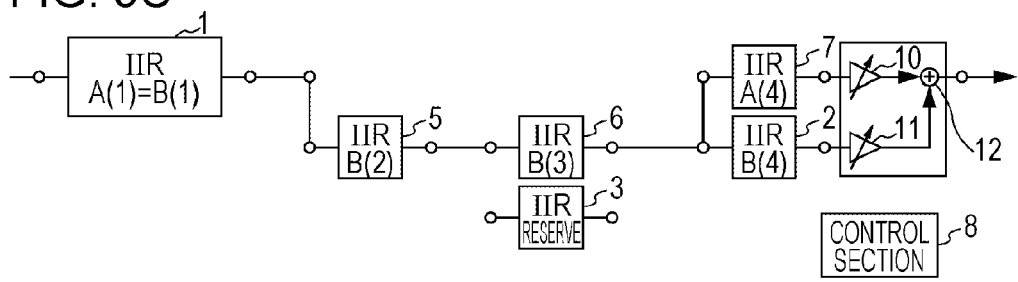

FIG. 5C is a diagram illustrating a connection in which a characteristic of the IIR filter 7 is changed and crossfading is performed. A crossfader including the reserve (unused) IIR filters 1, 2, the amplifiers 10, 11 and the adder 12 is connected to a stage of the IIR filter 7 as illustrated in FIG. 5C. It is not necessary to use two reserve (unused) IIR filters without fail as in the case of the second embodiment, and it is possible to perform crossfading using only one reserve (unused) IIR filter.

At this time, the IIR filter 2, which has become reserved (unused) in FIG. 5B, is set to the characteristics B(4). The original characteristics of the IIR filter 7 is A(4). Next, the crossfader performs crossfading from the IIR filter 7 to the IIR filter 2. After the crossfading is complete, the invalidated IIR filter 7 and the crossfader that has completed crossfading are cut off, and the buffer of the IIR filter 7 is cleared. That is to say, A(4), which is the characteristic of the IIR filter 7 is cleared and is set to unused. That is to say, the characteristics is reserved.

Thereby, it is possible to replace the IIR filters 3, 7 having the characteristics A(3), A(4) by the IIR filter 1, 2 having the characteristics B(3), B(4), respectively.

Figure 5D:
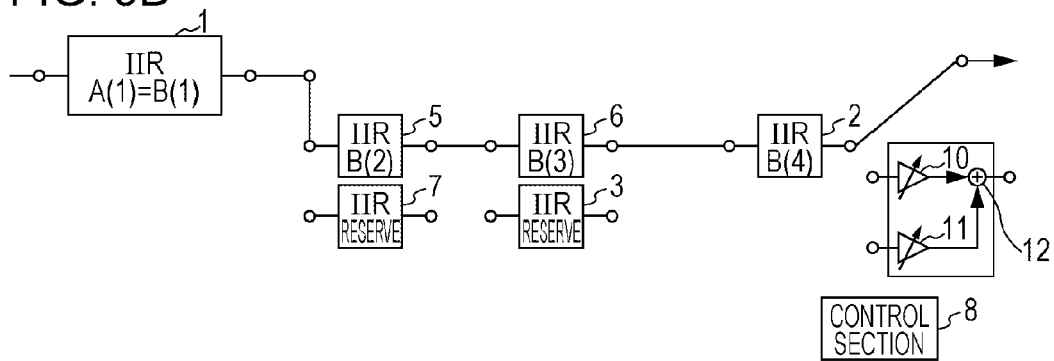

FIG. 5D is a diagram after IIR filters 2, 3 and 7 have been replaced by the IIR filters 5, 6 and 2, respectively. The IIR filters 3, 7 become reserved (unused).

By the above processing, the IIR filter 2 having the characteristic A(2), the IIR filter 3 having the characteristic A(3), the IIR filter 7 having the characteristic A(3), which are included in the equalizer, are replaced by the IIR filter 5 having the characteristic B(2), the IIR filter 6 having the characteristic B(3), the IIR filter 2 having the characteristic B(4), respectively, and thus the characteristic of the equalizer can be changed.

In this case, it is possible to set the number of IIR filters for changing the characteristics to two or one. It is possible to increase the processing speed compared with the method described with reference to FIGS. 1A to 1G.

Figure 6:
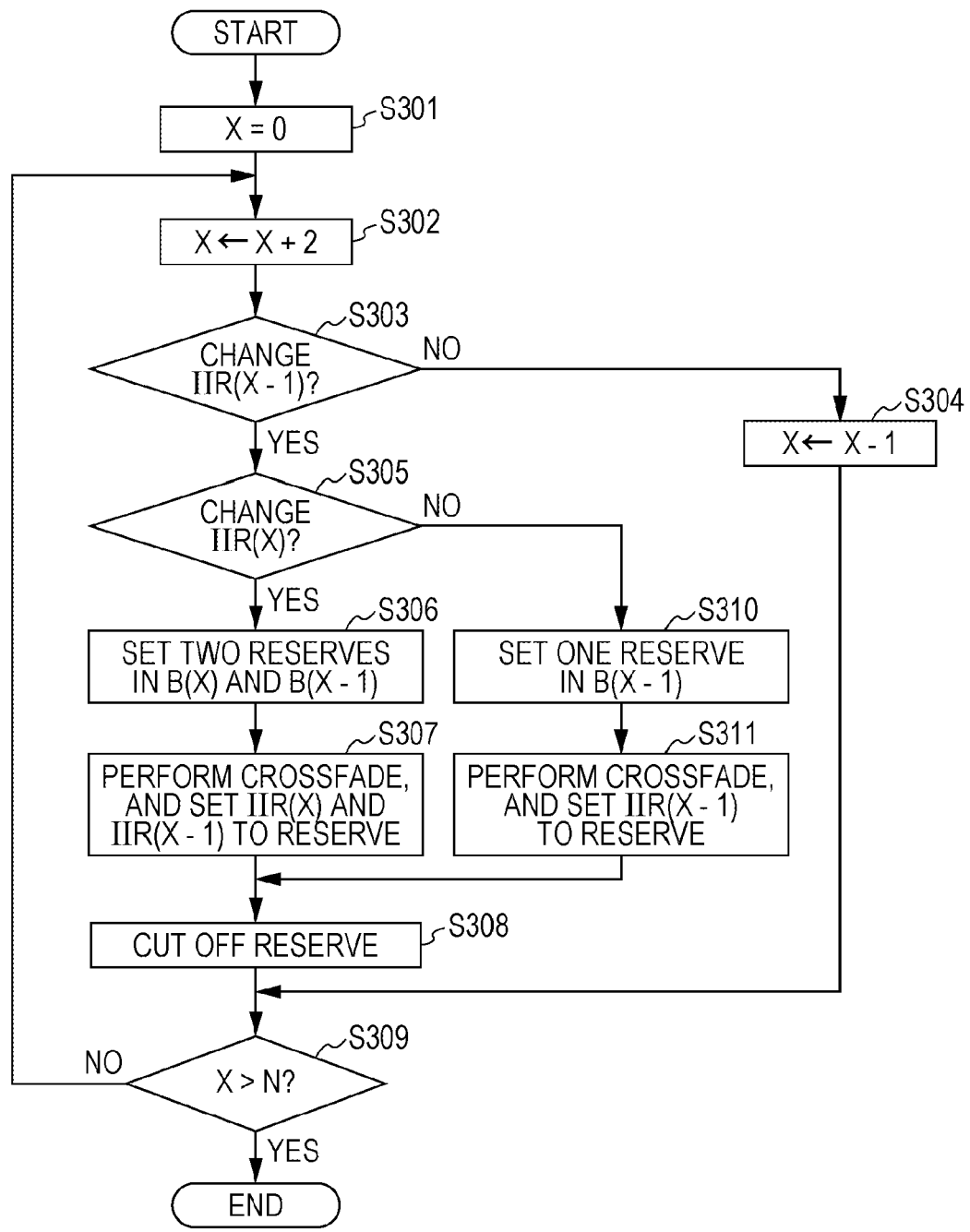
FIG. 6 is a flowchart according to the third embodiment.

FIG. 6 is a flowchart according to the third embodiment of the present disclosure. The above-described procedure is expressed in a form of a flowchart.

The above-described procedure will be described with reference to FIG. 6.

In step S301, control section 8 sets X to 0. That is to say, the control section 8 clears X.

In step S302, the control section 8 counts up X by two. An initial value of X is 2.

In step S303, the control section 8 determines whether to change the characteristic of the IIR filter 1. If the characteristic of the IIR filter 1 is not changed, the processing proceeds to step S304. Here, the characteristic of the IIR filter 1 is not changed and the processing proceeds to step S304.

In step S304, the control section 8 counts down X by 1. X becomes 1. N is not greater than 4, and thus the processing proceeds to step S302 after determination in step S309. X is counted up by 2, and thus X becomes 3. The processing proceeds to step S303. In 5303, the control section 8 determines whether to change the characteristic of the IIR filter 2 or not. The IIR filter 2 is changed, and thus the processing proceeds to step S305.

In step S305, the control section 8 determines whether to change the characteristic of the IIR filter 3 or not. The IIR filter 3 is changed, and thus the processing proceeds to step S306.

In step S306, the control section 8 sets two reserve (unused) IIR filters 5 and 6 to have the characteristics of B(2) and B(3), respectively.

In step S307, the control section 8 crossfades the IIR filter 2 having A(2) and the IIR filter 3 having the A(3) to the IIR filter 5 having the B(2) and the IIR filter 6 having the B(3), respectively. And the IIR filter 2 and the IIR filter 3 become reserved (unused).

In step S308, the control section 8 cuts off the crossfader including the reserved (unused) IIR filter 2 and IIR filter 3, the amplifiers 10, 11 and the adder 12. Next, the processing proceeds to step S309.

In the determination in step S309, X is 3 and is not greater than 4. Thus the processing proceeds to step S302, and the control section 8 counts up X by two. X becomes 5. The IIR filter 7 having the characteristic A(4) is changed, the IIR filter having A(5) is not changed (existent), and thus the processing proceeds to step S310.

In step S310, the control section 8 sets one reserved (unused) IIR filter to have the characteristic of B(4).

In step S311, the control section 8 crossfades the IIR filter 7 having A(4) to the IIR filter 2 having B(4). And the control section 8 changes the IIR filter 7 to reserved (unused).

In step S308, the control section 8 cuts off the crossfader including the reserved IIR filter 7 and IIR filter 3, the amplifiers 10, 11 and the adder 12.

The processing proceeds to step S309. X is greater than 4, and thus the processing is terminated.

Here, a description has been given of the case where N is 4. However, the same processing is performed in the case where N is an any value.

By this processing, it is possible to replace the IIR filter 2 having the characteristic A(2), the IIR filter 3 having the characteristic A(3), and the IIR filter 7 having the characteristic A(4) by the IIR filter 5 having the characteristic B(2), the IIR filter 6 having the characteristic B(3), and the IIR filter 2 having the characteristic B(4), respectively, with keeping the characteristic of the IIR filter 1 as it is.

5. Fourth Embodiment

FIGS. 7A, 7B, 7C, and 7D are block diagrams for explaining a fourth embodiment of the present disclosure. The same reference letters are given to the same parts as those already described, and descriptions thereof will be omitted. These block diagrams represent configurations of a signal processing apparatus, and represent connection states of components for each processing for performing signal processing in FIG. 7A to FIG. 7D in the same manner as FIGS. 1A to 1G.

A signal processing apparatus according to the present embodiment includes IIR filters 1, 2, 3, a reserve IIR filter 4, amplifiers 21, 22, 23, 24, adders 25, 26, 27, and a control section 8. The amplifier 21 and the adder 25 are connected to the IIR filter 1. In the same manner, the amplifier 22, the adder 26, and the amplifier 23, the adder 23 are connected to the IIR filters 2, 3, respectively. The reserve IIR filter 4 and the amplifier 24 are provided for crossfade processing.

The signal processing apparatus is assumed to be an equalizer. The IIR filters 1, 2, and 3 constitute, with respect to an input signal (for example, an audio signal), for example, an equalizer. Here, it is assumed that the IIR filters are formed in three stages in series.

The reserve IIR filter 4 is in an unused state, and is used for changing a characteristic of the equalizer.

The control section 8 performs connection control of the individual components, and controls the amplifiers 21, 22, 23, 24, and the adders 25, 26, 27 to perform crossfade processing control.

In the present embodiment, an amplifier and an adder are connected to each IIR filter included in the equalizer whose characteristic has not been changed yet. As components for performing crossfade, reserve (unused) IIR filter and amplifier are provided. Thereby, it is possible to achieve the same function as that of the first embodiment.

A description will be given of a processing procedure for changing a characteristic of an equalizer according to the present embodiment with reference to FIGS. 7A to 7D. In order to change the characteristic, the IIR filters 1, 2, 3 are subjected to crossfading in sequence one by once in order to change characteristics.

Figure 7A:
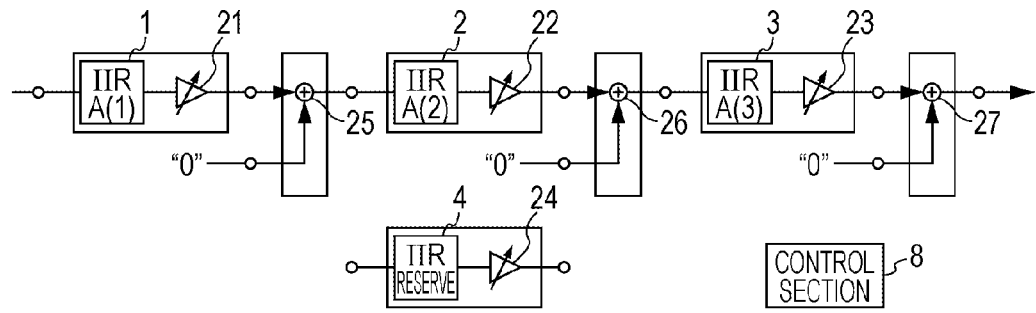
FIGS. 7A-7D are block diagrams according to a fourth embodiment.

FIG. 7A illustrates an original state. An input signal is subjected to signal processing through the IIR filters 1, 2, 3, and is output. An input signal goes through the IIR filters 1, 2 and 3 so as to be subjected to the signal processing, and is output. An amplifier and an adder are connected to each IIR filter, but the gain of the amplifier ought to be set to 1, and an input terminal of the adder, to which nothing is connected, ought to be in a no-signal state (0).

Figure 7B:
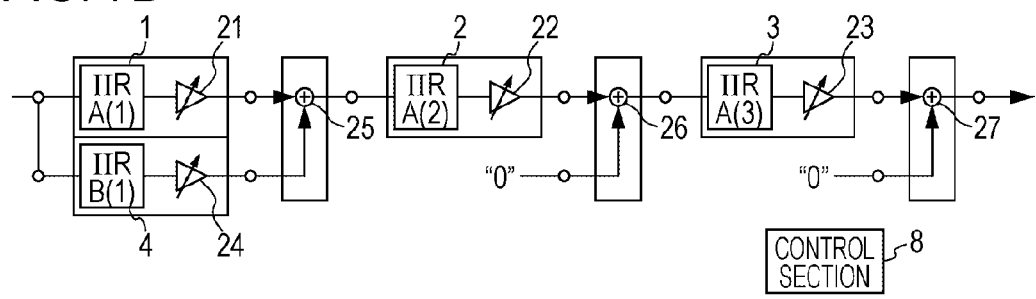

FIG. 7B is a diagram illustrating a connection in which a characteristic of the IIR filter 1 is changed and crossfading is performed. The reserve (unused) IIR filter 4, the amplifier 24, and the adder 12 are connected to a stage of the amplifier 21 and the adder 25 that are additionally connected to the IIR filter 1 as illustrated in FIG. 7B.

At this time, the IIR filter 4 is set to the characteristic B(1), to which a change is made. The original characteristic of the IIR filter 1 is A(1). Next, the crossfader including a connection of the IIR filter 4, the amplifier 24, the amplifier 21, and the adder 25 performs crossfading from the IIR filter 1 to the IIR filter 4. After crossfading is complete, the invalidated IIR filter 1 and the amplifier 21 connected thereto are cut off, and at the same time, an input terminal that has been connected to the amplifier 21 of the adder 25 is changed to a no-signal state (0). The buffer of the IIR filter 1 is cleared. That is to say, A(1), which is characteristic of the IIR filter 1 is cleared and changed to reserved (unused). Thereby, it is possible to replace the IIR filter 1 having the characteristic A(1) by the IIR filter 4 having the characteristic B(1).

Figure 7C:
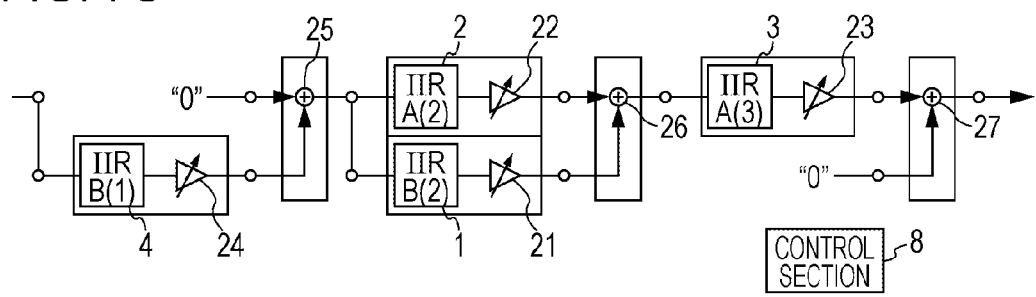

FIG. 7C is a diagram illustrating a connection in which the IIR filter 1 having the characteristic A(1) is replaced by the IIR filter 4 having the characteristic B(1), the IIR filter 2 having the characteristic A(2) is replaced by the IIR filter 1 having the characteristic B(2), and at the same time, the characteristic of the IIR filter 3 is changed and crossfading is performed.

The reserved (unused) IIR filter 1 and the amplifier 21 are additionally connected to a stage in which the amplifier 22 and the adder 26 are connected to the IIR filter 2.

At this time, the IIR filters 1, which has been reserved (unused) is set to the characteristics B(2), to which a change is made. In the same manner as in the case of FIG. 7B, crossfading is performed from the IIR filter 2 to the IIR filters 1. After crossfading is complete, the invalidated IIR filter 2 and the amplifier 21 connected thereto are cut off, and at the same time, an input terminal that has been connected to the amplifier 21 of the adder 26 is changed to a no-signal state (0). The buffer of the IIR filter 2 is cleared. That is to say, A(2), which is the characteristic of the IIR filter 2 is cleared and changed to reserved (unused). Thereby, it is possible to replace the IIR filter 2 having the characteristic A(2) by the IIR filter 1 having the characteristic B(2).

Figure 7D:
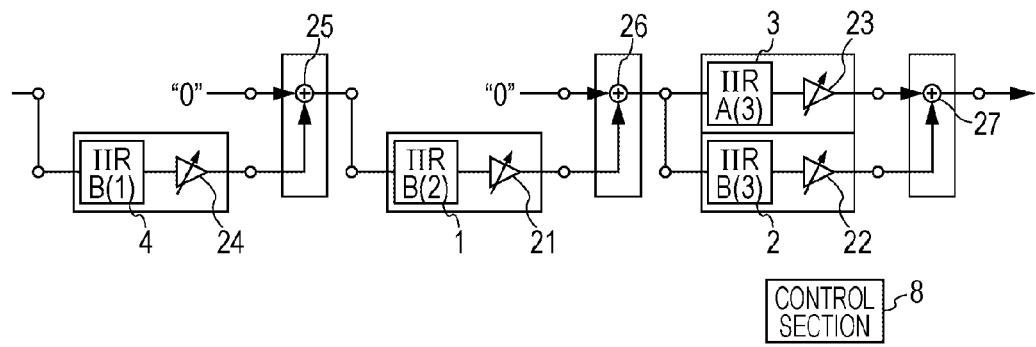

FIG. 7D is a diagram illustrating a connection in which the IIR filter 1 having the characteristic A(1) is replaced by the IIR filter 4 having the characteristic B(1), further the IIR filter 2 having the characteristic A(2) is replaced by the IIR filter 1 having the characteristic B(2), and at the same time, the characteristic of the IIR filter 3 is changed and crossfading is performed.

The reserved (unused) IIR filter 2 and the amplifier 22 are additionally connected to a stage in which the amplifier 23 and the adder 27 are connected to the IIR filter 3.

At this time, the IIR filters 2, which has been reserved (unused) is set to the characteristics B(3), to which a change is made. In the same manner as in the case of FIG. 7C, crossfading is performed from the IIR filter 3 to the IIR filters 2. After crossfading is complete, the invalidated IIR filter 3 and the amplifier 23 connected thereto are cut off, and at the same time, an input terminal that has been connected to the amplifier 23 of the adder 27 is changed to a no-signal state (0). The buffer of the IIR filter 3 is cleared. That is to say, A(3), which is the characteristic of the IIR filter 3 is cleared and changed to reserved (unused). Thereby, it is possible to replace the IIR filter 3 having the characteristic A(3) by the IIR filter 2 having the characteristic B(3).

By the above processing, the IIR filter 1 having the characteristic A(1), the IIR filter 2 having the characteristic A(2), the IIR filter 3 having the characteristic A(3), which are included in the equalizer, are replaced by the IIR filter 4 having the characteristic B(1), the IIR filter 1 having the characteristic B(2), the IIR filter 2 having the characteristic B(3), respectively, and thus the characteristic of the equalizer can be changed.

In the present embodiment, amplifiers and adders are connected to a plurality of original IIR filters, respectively, and further, an amplifier is connected to the reserved (unused) IIR filter. Accordingly, the processing flow thereof is the same as that of the first embodiment. Accordingly, a description thereof will be omitted.

6. Fifth Embodiment

FIGS. 8A, 8B, 8C, 8D and 8E are block diagrams for explaining a fifth embodiment of the present disclosure. The same reference letters are given to the same parts as that already described, and descriptions will be omitted. These block diagrams represent configurations of a signal processing apparatus, and represent connection states of components for individual processing for signal processing as illustrated in FIG. 8A to FIG. 8E.

A signal processing apparatus according to the present embodiment includes IIR filters 1, 2, 3, a reserve IIR filter 4, amplifiers 31, 32, 33, 34, 35, 36, 37, 38, an adders 41, 42, 43, 44, and a control section 8. The amplifier 31, 33, and 35 are connected to output sides of the IIR filter 1, 2 and 3, respectively. Further, amplifiers 32, 34 and 36 are provided so as to bypass the IIR filter 1 and the amplifier 31, the IIR filter 2 and the amplifier 33, and the IIR filter 3 and the amplifier 35, respectively.

An output of the amplifier 31 and an output of the amplifier 32 are connected to the adder 41, and an output of the adder 41 is connected to an input of the IIR filter 2. An output of the amplifier 33 and an output of the amplifier 34 are connected to the adder 42, and an output of the adder 42 is connected to an input of the IIR filter 3. An output of the amplifier 35 and an output of the amplifier 36 are connected to the adder 43. An output of the adder 43 is connected to an input of the reserve IIR filter 4.

Also, an amplifier 37 is connected to an output side of the reserve IIR filter 4 for performing the above-described crossfade, an amplifier 38 is disposed to bypass the reserve IIR filter 4 and the amplifier 37, and an output of the amplifier 37 and an output of the amplifier 38 are connected to the adder 44.

The signal processing apparatus according to the present embodiment is assumed to be an equalizer. The IIR filters 1, 2, and 3 constitute, with respect to an input signal (for example, an audio signal), for example, an equalizer. Here, it is assumed that the IIR filters are formed in three stages in series.

The reserve IIR filter 4 is in an unused state, and is used for changing a characteristic of the equalizer.

The control section 8 performs connection control of the individual components, and controls the amplifiers 31, 32, 33, 34, 35, 36, 37 and 38 to perform crossfade processing control.

In the present embodiment, an amplifier and an adder are connected to each IIR filter included in an equalizer whose characteristic has not been changed yet. As components for performing crossfade, the reserved (unused) IIR filter 4 is connected in series so that the total characteristic is changed.

A description will be given of a processing procedure for changing a characteristic of an equalizer according to the present embodiment with reference to FIGS. 8A to 8E. In order to change the characteristic, the IIR filters 1, 2 and 3 are subjected to crossfading in sequence one by once in order to change the characteristics.

Figure 8A:
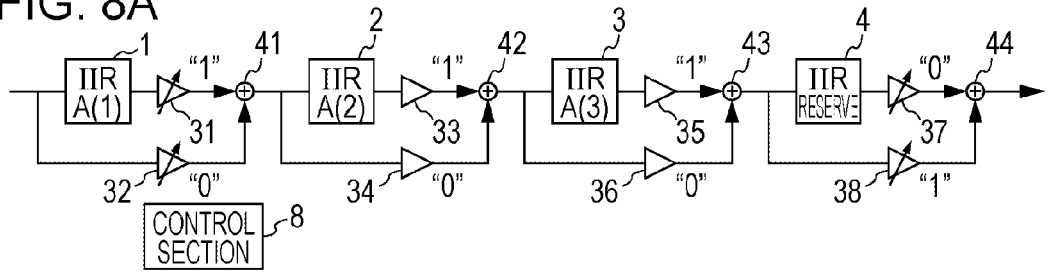
FIGS. 8A-8E are block diagrams according to a fifth embodiment.

FIG. 8A illustrates an original state. An input signal goes through the IIR filters 1, 2 and 3, and is subjected to signal processing. In this case, gains of the amplifiers 31, 33, 35 and 38 are set to 1. Output signals of the amplifier 32, 34, 36 and 37 are set to a no-signal state (gain 0). Thereby, the input signal goes through the IIR filters 1, 2 and 3, and bypasses the reserve IIR filter 4 to be output.

Figure 8B:
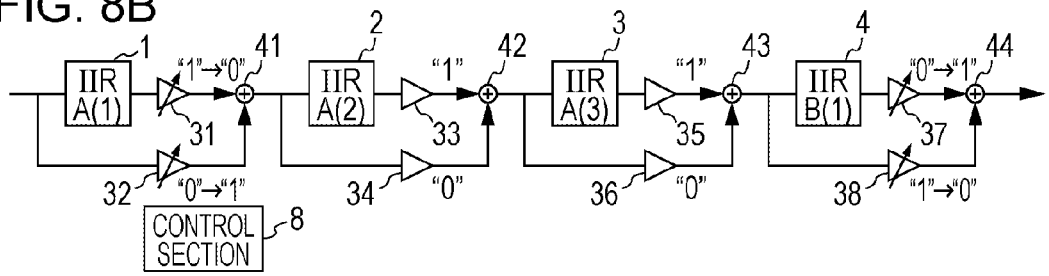

FIG. 8B is a diagram illustrating a connection state in which a characteristic of the IIR filter 1 is changed and crossfading is performed. First, the characteristic of the reserve IIR filter 4 is set to characteristic B(1), to which a change is made.

The amplifier 37 is changed from a state having no output signal (gain 0) to a state having an output signal (gain 1). The amplifier 38 is changed from a state having an output signal (gain 1) to a state having no output signal (gain 0). At the same time, the amplifier 31 is changed from a state having an output signal (gain 1) to a state having no output signal (gain 0), and the amplifier 32 is changed from a state having no output signal (gain 0) to a state having an output signal (gain 1). Thereby, the output signal of the IIR filter 1 is crossfaded to the output signal of the IIR filter 4, and the IIR filter 1 having the characteristic A(1) is replaced by the IIR filter 4 having the characteristic B(1).

Figure 8C:
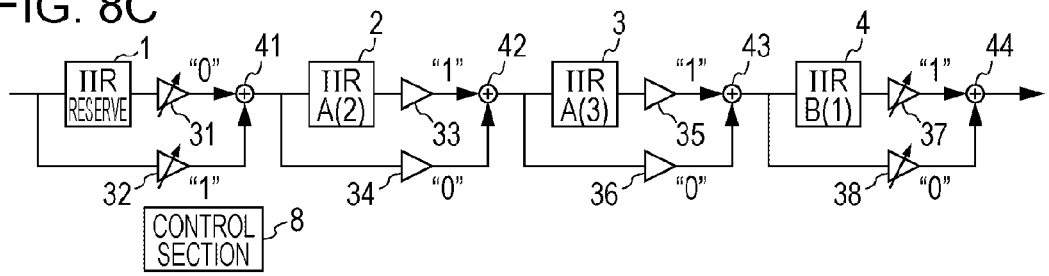

FIG. 8C is a diagram illustrating a state in which the buffer of the IIR filter 1 is cleared so that the characteristic A(1) is cleared, and is changed to reserved (unused).

Figure 8D:
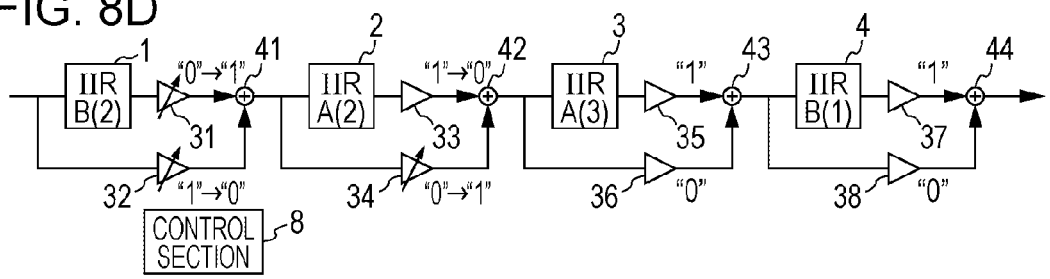

FIG. 8D is a diagram illustrating a connection state in which the characteristic of the IIR filter 2 is changed to perform crossfading. First, the characteristic of the reserve IIR filter 1 is set to characteristic B(2), to which a change is made.

The amplifier 31 is changed from a state having no output signal (gain 0) to a state having an output signal (gain 1). The amplifier 32 is changed from a state having an output signal (gain 1) to a state having no output signal (gain 0). At the same time, the amplifier 33 is changed from a state having an output signal (gain 1) to a state having no output signal (gain 0), and the amplifier 34 is changed from a state having no output signal (gain 0) to a state having an output signal (gain 1). Thereby, the output signal of the IIR filter 2 is crossfaded to the output signal of the IIR filter 1, and the IIR filter 2 having the characteristic A(2) is replaced by the IIR filter 1 having the characteristic B(2).

Figure 8E:
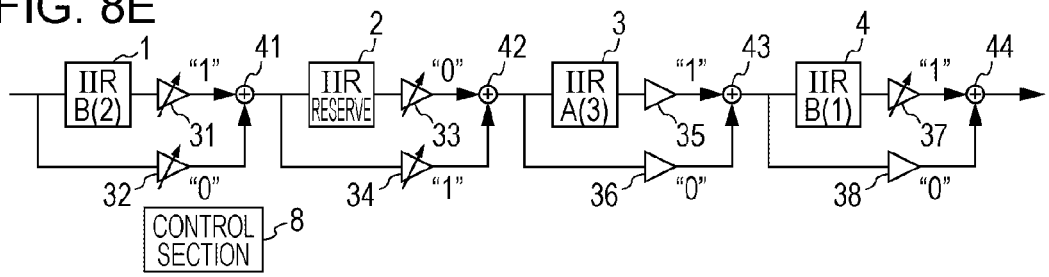

FIG. 8E is a diagram illustrating a state in which the buffer of the IIR filter 2 is cleared so that the characteristic A(2) is cleared, and the filter is changed to reserved (unused).

The IIR filter 3 is also connected and controlled in the same manner as illustrated in FIG. 8B, FIG. 8C or FIG. 8D, FIG. 8E so that the output of the IIR filter 3 having the characteristic A(3) is crossfaded to the output of the IIR filter 2 having the characteristic B(3), and thus it is possible to replace the IIR filter 3 having the characteristic A(3) by the IIR filter 2 having the characteristic B(3).

Figure 9:
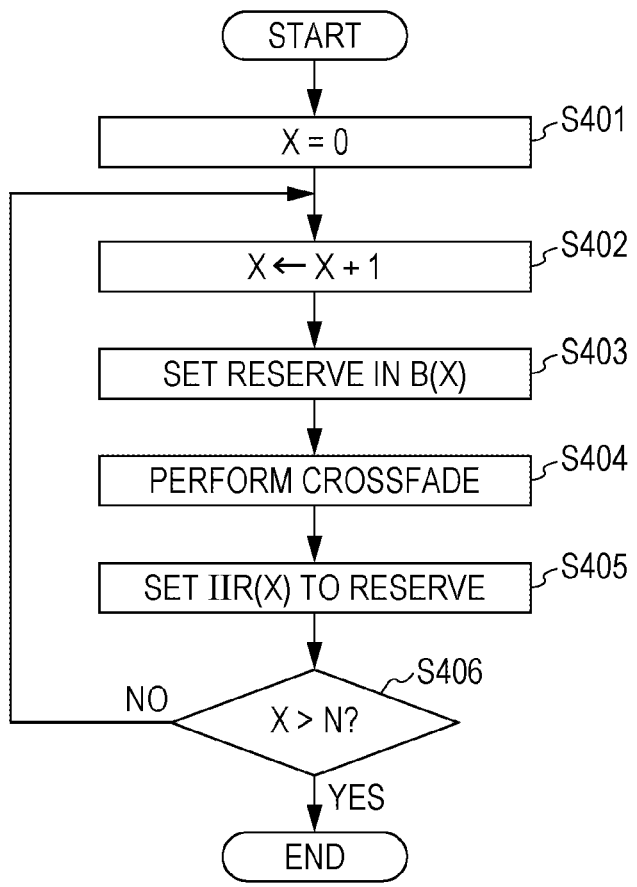
FIG. 9 is a flowchart according to the fifth embodiment.

FIG. 9 is a flowchart according to a fifth embodiment of the present disclosure. The above-described procedure is expressed in a form of a flowchart.

The above-described procedure will be described with reference to FIG. 9.

In step S401, the control section 8 sets X to 0. That is to say, the control section 8 clears X.

In step S402, the control section 8 counts up X. An initial value of X is 1.

In step S403, the control section 8 sets a reserve IIR filter 4 to have the characteristic of B(1).

In step S404, the control section 8 crossfades the output of the IIR filter 1 having A(1) to the output of the IIR filter 4 having B(1).

In step S405, the control section 8 changes the IIR filter 1 to reserved (unused).

In step S406, the control section 8 checks whether X is greater than 4 or not. If not greater than 4, the processing from step S402 to step S406 is repeated until X becomes 4.

By the above processing, it is possible to change the characteristic of the equalizer.

7. Sixth Embodiment

FIGS. 10A, 10B, 10C, 10D, 10E, 10F and 10G are block diagrams for explaining a sixth embodiment of the present disclosure. The same reference letters are given to the same parts as that already described, and descriptions thereof will be omitted. These block diagrams represent configurations of a signal processing apparatus, and represent connection states of components for each processing for performing signal processing as illustrated in FIG. 10A to FIG. 10G.

A signal processing apparatus according to the present embodiment includes IIR filters 1, 2, 3, a reserve IIR filter 4, amplifiers 51, 52, 53, 54, an adder 45, and a control section 8. The amplifier 52, 53 and 54 are connected to output sides of the IIR filter 1, 2 and 3, respectively.

The amplifier 51 is connected to the output side of the reserve IIR filter for performing crossfading. Further, outputs of the amplifiers 52, 53, 54, and 51 are connected to the adder 45.

A signal processing apparatus according to the present embodiment is the case where the IIR filters 1, 2 and 3 are connected in parallel. Further, in order to perform crossfading, four reserve IIR filters 4 are connected in parallel so that the characteristic of the signal processing apparatus is changed. The control section 8 performs connection control of each component, and performs control of the amplifiers 52, 53, 54 and 51, and crossfade processing control.

A description will be given of a processing procedure for changing a characteristic of a signal processing apparatus according to the present embodiment with reference to FIGS. 10A to 10G. In order to change the characteristic, the IIR filters 1, 2 and 3 are subjected to crossfading in sequence one by once in order to change the characteristic.

FIG. 10A illustrates an original state. An input signal is received and subjected to signal processing by each of the IIR filters 1, 2, and 3, and a combined output thereof is output. In this case, the amplifiers 52, 53 and 54 are set to a state having output (gain 1), and the amplifier 51 is set to a state having no (gain 0).

FIG. 10B is a diagram illustrating a connection state in which a characteristic of the IIR filter 1 is changed and crossfading is performed. First, the characteristic of the reserve IIR filter 4 is set to the characteristic B(1), to which a change is made.

The amplifier 51 is changed from a state having no output signal (gain 0) to a state having an output signal (gain 1). At the same time, the amplifier 52 is changed from a state having an output signal (gain 1) to a state having no output signal (gain 0). Thereby, the output signal of the IIR filter 1 is crossfaded to the output signal of the IIR filter 4, and the IIR filter 1 having the characteristic A(1) is replaced by the IIR filter 4 having the characteristic B(1).

FIG. 10C is a diagram illustrating a state in which the buffer of the IIR filter 1 is cleared so that the characteristic A(1) is cleared, and is changed to reserved (unused).

FIG. 10D is a diagram illustrating a connection state in which the characteristic of the IIR filter 2 is changed to perform crossfading. First, the characteristic of the reserve IIR filter 1 is set to the characteristic B(2), to which a change is made.

The amplifier 52 is changed from a state having no output signal (gain 0) to a state having an output signal (gain 1). The amplifier 53 is changed from a state having an output signal (gain 1) to a state having no output signal (gain 0). Thereby, the output signal of the IIR filter 2 is crossfaded to the output signal of the IIR filter 1, and the IIR filter 2 having the characteristic A(2) is replaced by the IIR filter 1 having the characteristic B(2).

FIG. 10E is a diagram illustrating a state in which the buffer of the IIR filter 2 is cleared so that the characteristic A(2) is cleared, and the filter is changed to reserved (unused).

FIG. 10F is a connection state in which the characteristic of the IIR filter 3 is changed, and crossfading is performed. First, the characteristic of the reserve IIR filter 2 is changed to the characteristic B(3), to which a change is made.

The amplifier 53 is changed from a state having no output signal (gain 0) to a state having an output signal (gain 1). At the same time, the amplifier 54 is changed from a state having an output signal (gain 1) to a state having no output signal (gain 0). Thereby, the output signal of the IIR filter 3 is crossfaded to the output signal of the IIR filter 2, and the IIR filter 3 having the characteristic A(3) is replaced by the IIR filter 2 having the characteristic B(3).

FIG. 10G illustrates a state in which all the characteristics of the signal processing apparatus have been changed. The buffer of the IIR filter 3 is cleared, and finally, the IIR filter 3 is changed to reserved (unused).

The processing flow thereof is different from that of the first embodiment only in that the IIR filters are connected in parallel, and basically the same as that of the first embodiment. Accordingly, a description of the processing flow will be omitted.

In this regard, the present technique can also be configured as follows.

(1) A signal processing apparatus including:
a control section;
a signal processing section connected with a plurality of signal processing elements and configured to perform signal processing for enhancing or attenuating an input signal in a specific frequency band; and
a crossfade signal section including a crossfade signal processing element capable of replacing at least one of the signal processing elements among the plurality of signal processing elements,
wherein the control section is configured to control any one of the signal processing elements among the plurality of signal processing elements, and the crossfade signal processing element in the crossfade signal section, to crossfade to the crossfade signal processing element having the signal processing element as a new characteristic, to perform processing for replacing any one of the signal processing elements by the crossfade signal processing element, and to perform the processing on remaining signal processing elements of the plurality of signal processing elements in the signal processing section.

(2) The signal processing apparatus according to (1), wherein the signal processing elements are IIR filters.

(3) The signal processing apparatus according to (2), wherein the crossfade IIR filters are plural.

(4) The signal processing apparatus according to (2) or (3), wherein the plurality of IIR filters are connected in series.

(5) The signal processing apparatus according to any one of (2) to (4), wherein the crossfade signal section includes the crossfade signal IIR filter, an amplifier, and an adder.

(6) The signal processing apparatus according to any one of (3) to (5),
wherein a number of the plurality of crossfade IIR filters to replace any one of the plurality of IIR filters can be changed.

(7) The signal processing apparatus according to any one of (2) to (6),
wherein the plurality of IIR filters are connected to amplifiers and adders, respectively, and the crossfade signal section includes the crossfade IIR filter and the adder.

(8) The signal processing apparatus according to (4),
wherein a bypass amplifier is disposed so as to pass through each IIR filter and an amplifier at an output side of the IIR filter of the plurality of IIR filters,
a crossfade bypass amplifier is further disposed so as to pass through the crossfade signal IIR filter and an amplifier at an output side of the crossfade signal IIR filter, and
the control section is configured to control the amplifier and the crossfade pass amplifier.

(9) The signal processing apparatus according to (2) or (3),
wherein the plurality of IIR filters in the signal processing section are connected in parallel, and further a crossfade IIR filter is connected in parallel.

The present disclosure contains subject matter related to that disclosed in Japanese Priority Patent Application JP 2011-266974 filed in the Japan Patent Office on Dec. 6, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A signal processing apparatus, comprising:
circuitry that comprises a first amplifier, a second amplifier, a first adder, a plurality of signal processing filters and at least one crossfade signal processing filter, wherein the circuitry is configured to:
enhance or attenuate an input signal in a specific frequency band;
replace at least one signal processing filter among the plurality of signal processing filters;
control the at least one signal processing filter among the plurality of signal processing filters, and the at least one crossfade signal processing filter, to crossfade to the at least one crossfade signal processing filter having a new characteristic; and
replace the at least one signal processing filter by the at least one crossfade signal processing filter, to process remaining signal processing filters of the plurality of signal processing filters,
wherein a first input terminal of the at least one crossfade signal processing filter is directly connected to a first input terminal of the first amplifier, and wherein the first input terminal of the first amplifier is different from the first input terminal of the at least one crossfade signal processing filter, and an output terminal of the at least one crossfade signal processing filter is connected to the first adder via the second amplifier.

2. The signal processing apparatus according to claim 1, wherein the plurality of signal processing filters includes one IIR filter or a plurality of IIR filters and one crossfade IIR filter or a plurality of crossfade IIR filters.

3. The signal processing apparatus according to claim 2, wherein the plurality of IIR filters are connected in series.

4. The signal processing apparatus according to claim 3, wherein the circuitry further comprises:

a bypass amplifier configured to bypass each of the plurality of IIR filters and a third amplifier at an output side of the plurality of IIR filters, and wherein the first amplifier is configured to bypass the one crossfade IIR filter and the second amplifier at an output side of the one crossfade IIR filter, and the circuitry is further configured to control the first amplifier and the second amplifier.

5. The signal processing apparatus according to claim 2, wherein a number of the plurality of crossfade IIR filters to replace one of the plurality of IIR filters is changeable.

6. The signal processing apparatus according to claim 2, wherein the circuitry further includes a third amplifier, a second adder, and the one crossfade IIR filter or the plurality of crossfade IIR filters, and wherein the plurality of IIR filters are connected to the third amplifier and the second adder.

7. The signal processing apparatus according to claim 1, wherein the circuitry further includes at least one crossfade IIR filter.

8. The signal processing apparatus according to claim 1, wherein the circuitry further includes a plurality of IIR filters and a crossfade IIR filter, and wherein the plurality of IIR filters and the crossfade IIR filter are connected in parallel.

9. The signal processing apparatus according to claim 1, wherein an output terminal of the first amplifier is connected to the first adder.

10. A method of processing an input signal, comprising:
in a signal processing apparatus including circuitry that comprises a first amplifier, a second amplifier, an adder, a plurality of IIR filters and at least one crossfade IIR filter:
enhancing or attenuating the input signal in a specific frequency band;
controlling the at least one crossfade IIR filter and changing the at least one crossfade IIR filter to have a new characteristic;
crossfading at least one IIR filter among the plurality of IIR filters to the at least one crossfade IIR filter having the new characteristic;
wherein a first input terminal of the at least one crossfade IIR filter is directly connected to a first input terminal of the first amplifier, the first input terminal of the first amplifier is different from the first input terminal of the at least one crossfade IIR filters, and an output terminal of the at least one crossfade IIR filter is connected to the adder via the second amplifier; and
replacing the at least one IIR filter by the at least one crossfade IIR filter.

* * * * *